United States Patent
Terada et al.

[11] Patent Number: 5,874,773
[45] Date of Patent: Feb. 23, 1999

[54] LEAD FRAME HAVING A SUPPORTING PAD WITH A PLURALITY OF SLITS ARRANGED TO PERMIT THE FLOW OF RESIN SO AS TO PREVENT THE OCCURRENCE OF VOIDS

[75] Inventors: Kazuhiro Terada, Kokubunji; Kunihiro Tsubosaki, Hino; Hiroshi Watanabe, Tachikawa; Kazunari Suzuki, Tokyo, all of Japan

[73] Assignees: Hitachi, Ltd.; Hitachi Microcomputer System, Ltd., both of Tokyo, Japan

[21] Appl. No.: 841,329

[22] Filed: Apr. 30, 1997

Related U.S. Application Data

[63] Continuation of Ser. No. 517,342, Aug. 21, 1995, abandoned.

[30]     Foreign Application Priority Data

Sep. 1, 1994   [JP]   Japan ................................... 6-208403

[51] Int. Cl.$^6$ .................................................. H01L 23/48
[52] U.S. Cl. .......................................... 257/676; 257/669
[58] Field of Search ................................. 257/676, 669, 257/668

[56]                References Cited

U.S. PATENT DOCUMENTS

| | | | |
|---|---|---|---|
| 4,732,733 | 3/1988 | Sakamoto et al. | 257/676 |
| 4,797,726 | 1/1989 | Manabe | 257/669 |
| 4,809,053 | 2/1989 | Kuraishi | 257/669 |
| 4,884,124 | 11/1989 | Mori et al. | 257/676 |
| 4,918,511 | 4/1990 | Brown | 257/669 |
| 4,952,999 | 8/1990 | Robinson et al. | 257/669 |
| 5,150,193 | 9/1992 | Yasuhara et al. | 257/669 |
| 5,233,222 | 8/1993 | Djennas et al. | 257/676 |
| 5,289,032 | 2/1994 | Higgins, III et al. | 257/669 |
| 5,304,843 | 4/1994 | Takubo et al. | 257/672 |
| 5,378,656 | 1/1995 | Kajihara et al. | 437/217 |
| 5,397,915 | 3/1995 | Nose | 257/676 |
| 5,554,885 | 9/1996 | Yamasaki et al. | 257/666 |
| 5,661,338 | 8/1997 | Yoo et al. | 257/676 |
| 5,708,294 | 1/1998 | Toriyama | 257/676 |
| 5,712,507 | 1/1998 | Eguchi et al. | 257/666 |

FOREIGN PATENT DOCUMENTS

| | | | |
|---|---|---|---|
| 0293970 | 12/1988 | European Pat. Off. | 257/669 |
| 63-44749 | 2/1988 | Japan . | |
| 1-0076741 | 3/1989 | Japan | 257/669 |
| 4-22162 | 1/1992 | Japan . | |
| 7-50312 | 2/1995 | Japan . | |

OTHER PUBLICATIONS

Nikkei Micro Device, Nikkei BP Co., May 1991, pp. 94–99.
Nikkei Electronics, Nikkei BP Co., Jan. 21, 1991, pp. 132–136.

*Primary Examiner*—Jerome J. Jackson
*Assistant Examiner*—David B. Hardy
*Attorney, Agent, or Firm*—Fay, Sharpe, Beall, Fagan, Minnich & McKee

[57]              ABSTRACT

The resin-sealed package includes a lead frame having a supporting and heat spreading pad and inner and outer leads arranged to surround the supporting and head spreading pad. A tape automated bonding (TAB) structure is provided having a semiconductor chip having bonding pads formed on a periphery of a main surface of the semiconductor chip. A rear surface of the semiconductor chip is fixed to the supporting and head spreading pad. TAB leads are provided on the main surface of the semiconductor chip. One end of each TAB lead is connected with said bonding pads and the other end of each TAB lead is connected with one end of each inner lead of the lead frame. A resin molding is used for sealing the TAB structure and the supporting and head spreading pad and inner leads of the lead frame. An area of the supporting and head spreading pad is larger than that of the semiconductor chip of said TAB structure. The supporting and heat spreading pad includes a first slit positioned under the semiconductor chip and a second slit positioned outside of the semiconductor chip in a plane view.

12 Claims, 13 Drawing Sheets

LEAD FRAME HAVING A SUPPORTING PAD WITH A PLURALITY OF SLITS ARRANGED TO PERMIT THE FLOW OF RESIN SO AS TO PREVENT THE OCCURRENCE OF VOIDS

This is a continuation application of Ser. No. 08/517,342, filed Aug. 21, 1995 now abandoned.

BACKGROUND OF THE INVENTION

The present invention relates to a lead frame and to a semiconductor integrated circuit device using the same. More specifically, the invention relates to technology that can be effectively adapted to semiconductor integrated circuit devices having a resin-molded LSI package.

In order to realize logic LSIs that operate at higher speed and have higher degree of functions, as represented by ASICs (Application Specific Integrated Circuits) such as gate arrays and CBICs (Cell-Based Integrated Circuits), and microcomputers, it is essential to improve a resin-molded LSI package for sealing a logic LSI, e.g., to increase the number of pins, to decrease the thermal resistance and to improve the reliability.

As LSI packages for sealing logic LSI, so far, there has been most extensively used a QFP (quad flat package) having leads along the four sides of the package body, and an ultra-multi-pin QFP has been put into practical use having hundreds of pins of leads.

In the QFP in which the package body is constituted by molding a resin, however, it becomes difficult to efficiently radiate the heat outside the package body as the amount of heat generated by the semiconductor chip increases.

In order to decrease the thermal resistance of the QFP, it has been proposed in which a heat spreader made of a metal plate is buried in a portion of the package body (NIKKEI MICRO DEVICE, Nikkei BP Co., May, 1991, pp. 94–99; NIKKEI ELECTRONICS, Nikkei BP Co., Jan. 21, 1991, pp. 132–136).

According to this technology, the heat spreader is stuck to the back surface of a die pad (tab) of the lead frame for mounting the semiconductor chip followed by molding it with resin, and the heat spreader is exposed from part of the package body. Then, the heat generated in the semiconductor chip is conducted to the heat spreader through the die pad and is radiated from the surface thereof. Thus, there is obtained a QFP having a small thermal resistance.

The QFP is constituted by several members such as semiconductor chip, lead frame and molding resin having different thermal properties (coefficient of thermal expansion, thermal conductivity, etc.), and stress tends to build up inside the package body due to the differences in the thermal properties. In the case of the resin-molded LSI package, in particular, the adhesion is not sufficiently strong in the interface between the lower surface of the die pad and the molding resin, and a large stress tends to build up at the interface.

Therefore, as the outside dimensions of the semiconductor chip mounted on the lead frame (i.e., outside dimensions of the die pad) increases, peeling takes place at the interface between the die pad and the molding resin when the package is heated at a high temperature in the steps of testing temperature cycles and thermal shocks or in the step of solder reflow. Therefore, water and impurities enter the space where peeling has taken place, resulting in the occurrence of cracks in the package and corrosion to the wiring.

To prevent peeling at the interface, it has been known to make a slit of a cross shape in the die pad of the lead frame as disclosed in, for example, Japanese Laid-Open Patent Publication No. 22162/1992. This technique is used for suppressing the peeling at the interface by making a slit in the die pad to bring part of the back surface of the semiconductor chip into direct contact with the molding resin, and by firmly adhering the semiconductor chip to the molding resin.

SUMMARY OF THE INVENTION

Logic LSIs as represented by ASICs and microcomputers have a feature that the demand for custom ICs of logic LSIs are higher than those of memory LSIs. Therefore, the LSI package for sealing the logic LSI requires technologies for producing various kinds of LSIs in small amounts, LSIs at reduced cost, and LSTs of QTAT (quick turn around time) in addition to technologies for decreasing the thermal resistance of the package and technologies for preventing peeling at the interface of the die pad.

According to a conventional technology in which a heat spreader (metal plate) is buried in part of the package body or a conventional technology in which a slit is made in the die pad of the lead frame, however, demands such as of production of a variety kinds of logic LSIs in small amounts, production at reduced cost, and production of LSIs of QTAT are not met.

The object of the present invention is to provide a technology that is capable of decreasing the thermal resistance of an LSI package for sealing a logic LSI.

Another object of the present invention is to provide a technology capable of improving the reliability of an LSI package for sealing a logic LSI.

A further object of the present invention is to provide a technology for producing a variety of LSI packages for sealing logic LSIs in small amounts.

A still further object of the present invention is to provide a technology for producing an LSI package for sealing a logic LSI at reduced cost.

Yet another object of the present invention is to provide a technology for producing an LSI package for sealing logic LSI of QTAT.

A further object of the present invention is to provide a technology for fabricating a LSI package having many pins for sealing a logic LSI.

These and other objects as well as novel features of the present invention will become more apparent from the description of the specification and the accompanying drawings.

Among the inventions disclosed in this application, a representative one will now be briefly described.

In a lead frame of the present invention, a die pad (supporting pad) for mounting a semiconductor chip is provided with a first slit that extends toward the outer periphery from the center thereof and second slits arranged along the outer periphery thereof, the ends of the first slit on the outer periphery side being positioned nearer the outer side than the ends of the central sides of the second slits.

In the lead frame of the present invention, an insulating material is placed along the outer circumference of the die pad.

The semiconductor integrated circuit device of the present invention has a package structure in which the semiconductor chip mounted on the die pad of the lead frame is molded with a resin, and the leads of the lead frame and the semiconductor chip are connected together by a TAB (tape automated bonding) method.

The semiconductor integrated circuit device of the present invention has a package structure in which the semiconductor chip mounted on the die pad of the lead frame is molded with a resin, and the leads of the lead frame and the semiconductor chip are connected together via coated wires having an insulating layer formed on the surfaces thereof.

According to the above-mentioned means, the ends of the first slit on the outer periphery side are positioned nearer the outer side than the ends of the central sides of the second slits. Therefore, when a semiconductor chip having any outside dimensions is mounted on the die pad, the back surface of the semiconductor chip is partly brought into direct contact with the molding resin at all times, enabling the semiconductor chip and the molding resin to be firmly joined together. Moreover, since the molding resin over the semiconductor chip and the molding resin under the molding resin are coupled to each other partly by the side surfaces of the semiconductor chip, the molding resins are firmly joined together.

Using the above-mentioned means, the resin that flows over (or under) the semiconductor chip during the molding flows into the opposite side of the semiconductor chip through slits; i.e., the resin flows uniformly over and under the semiconductor chip during the molding.

Using the above-mentioned means, it is possible to mount various kinds of semiconductor chips having dissimilar outside dimensions on the die pad. Therefore, the lead frame can be standardized, and there is no need for newly designing the lead frames for each of the kinds of the devices.

Using the above-mentioned means, the outside dimensions of the die pad is selected to be larger than the outside dimensions of the semiconductor chip, so that the heat generated in the semiconductor chip is partly and quickly diffused into the whole package body through the die pad and is radiated to the outside from the surface. It is therefore possible to decrease the thermal resistance of the package.

Using the above-mentioned means in which the semiconductor chip mounted on the die pad and the leads are connected together by the TAB method, it is possible to reliably prevent such defects that the wires are brought into contact with the edges of the die pad to cause short-circuiting. It is further possible to increase the number of pins of the package as a result of employing the TAB method which enables the leads to be formed at narrower pitches than that of the wire-bonding method.

Using the above-mentioned means in which the insulating material is placed along the outer periphery of the die pad, it is possible to reliably prevent such defects that the wires are brought into contact with the edges of the die pad to cause short-circuiting even when the leads of the lead frame and the semiconductor chip are connected together by the wire-bonding method.

Using the above-mentioned means in which the leads of the lead frame and the semiconductor chip are connected together using coated wires, it is possible to reliably prevent such defects that the wires are brought into contact with the edges of the die pad to cause short-circuiting or the wires are brought into contact with each other to cause short-circuiting.

DESCRIPTION OF THE PREFERRED EMBODIMENTS

Figure 1:
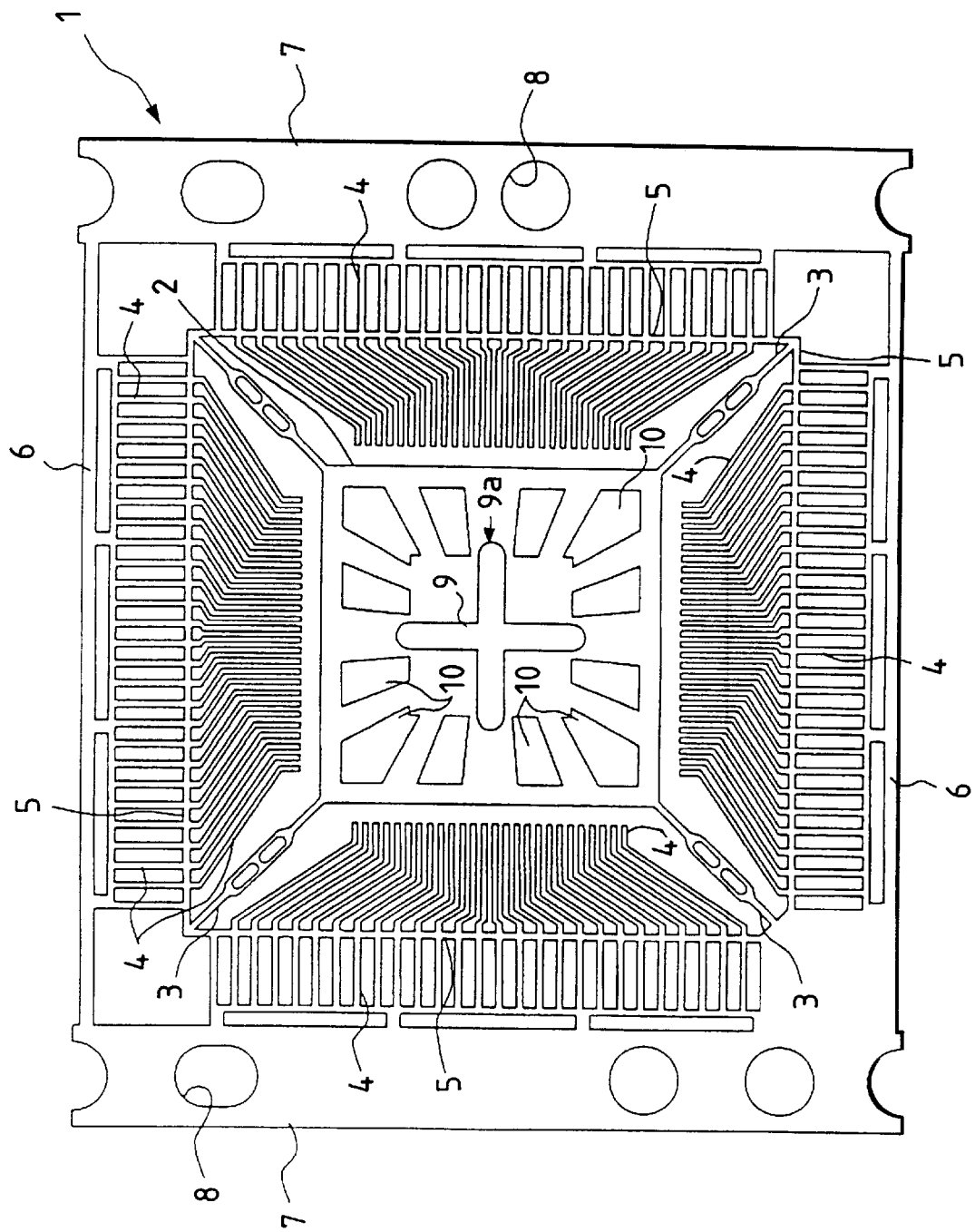
FIG. 1 is a plan view of a lead frame of an embodiment 1 of the present invention.

FIG. 1 is a plan view of a lead frame used for assembling a QFP of an embodiment of the present invention.

The lead frame 1 has a die pad (chip supporting pad) 2 of a square shape for mounting (pellet-bonding) a semiconductor chip on the central portion thereof. The die pad 2 is coupled to other portions of the lead frame 1 by four hanging leads 3 provided at four corners thereof. The lead frame is made of a material such as 42-alloy, copper or the like.

The die pad 2 is surrounded, by a number of leads 4 which are arranged along the sides thereof. A dam 5 is provided at intermediate portions of the leads 4 to prevent the resin from over-flowing and to prevent the leads 4 from being deformed at the time of molding. A portion of the lead 4 that is exposed from the package body after the molding is called outer lead portion, and a portion inside the package body is called inner lead portion.

An inner frame 6 and an outer frame 7 for supporting the leads 4 are provided surrounding the outer lead portions of the leads 4. At portions of the outer frame 7 are provided guide holes 8 that serve as a guide when the lead frame 1 is mounted on a mold.

The die pad 2, hanging leads 3, leads 4, dams 5, inner frame 6 and outer frame 7 constituting the lead frame 1 are formed as a unitary structure by pressing or etching a hoop member of an electrically conductive material such as 42 alloy, copper or the like having a thickness of, for example, about 100 to 150 $\mu$m. In practice, the lead frame is constituted by connecting plural unit frames constituted by the above-mentioned portions in one direction.

In the lead frame 1 of this embodiment, a slit (first slit) 9 of a cross shape is formed at the center of the die pad 2. Furthermore, along the outer periphery of the die pad 2 are radially arranged a plurality of slits (second slits) 10 of a shape different from the above slit 9 in a manner to surround the slit 9.

Figure 2:
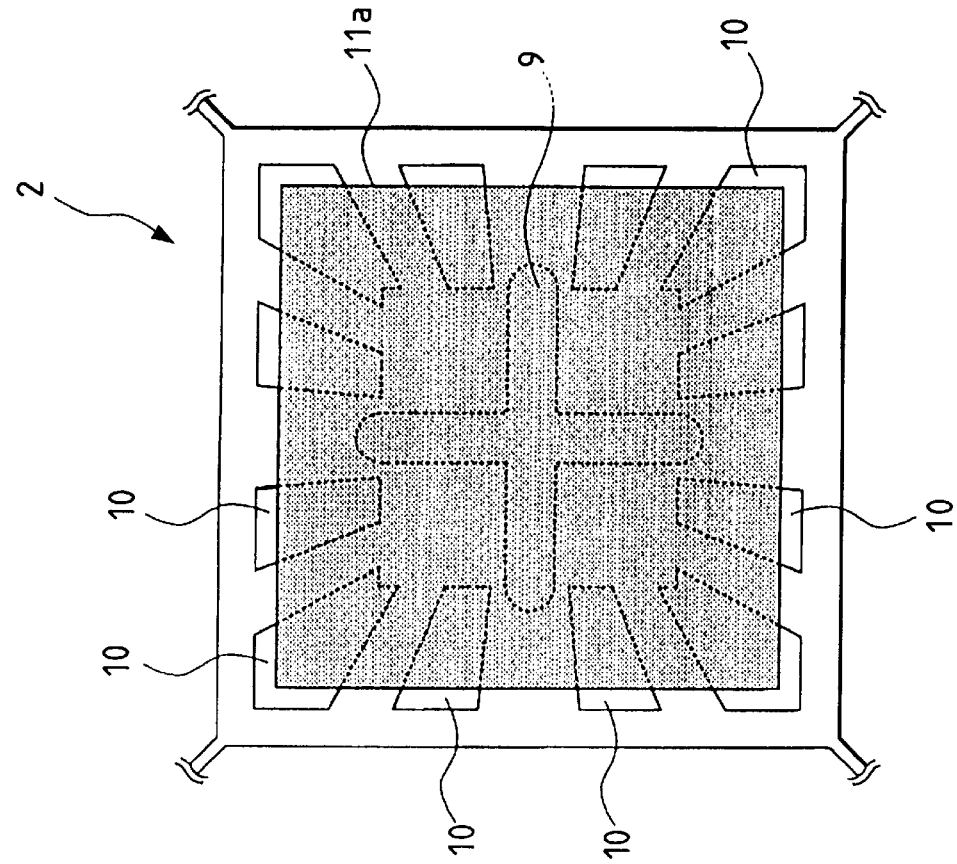
FIG. 2 is an enlarged plan view of a die pad of the lead frame shown in FIG. 1.

As shown on an enlarged scale in FIG. 2, the tips 9a of the slit 9 shape extend toward the outer periphery of the die pad 2 by a predetermined length ($\Delta x$) beyond the inner ends (ends on the central side of die pad 2) 10a of the slits 10 that are arranged in neighboring fashion thereto. That is, the slits 9 and 10 are so arranged that the ends 9a of the slit 9 intersect lines (not shown) passing through the inner ends 10a of the neighboring slits 10.

Figure 3:
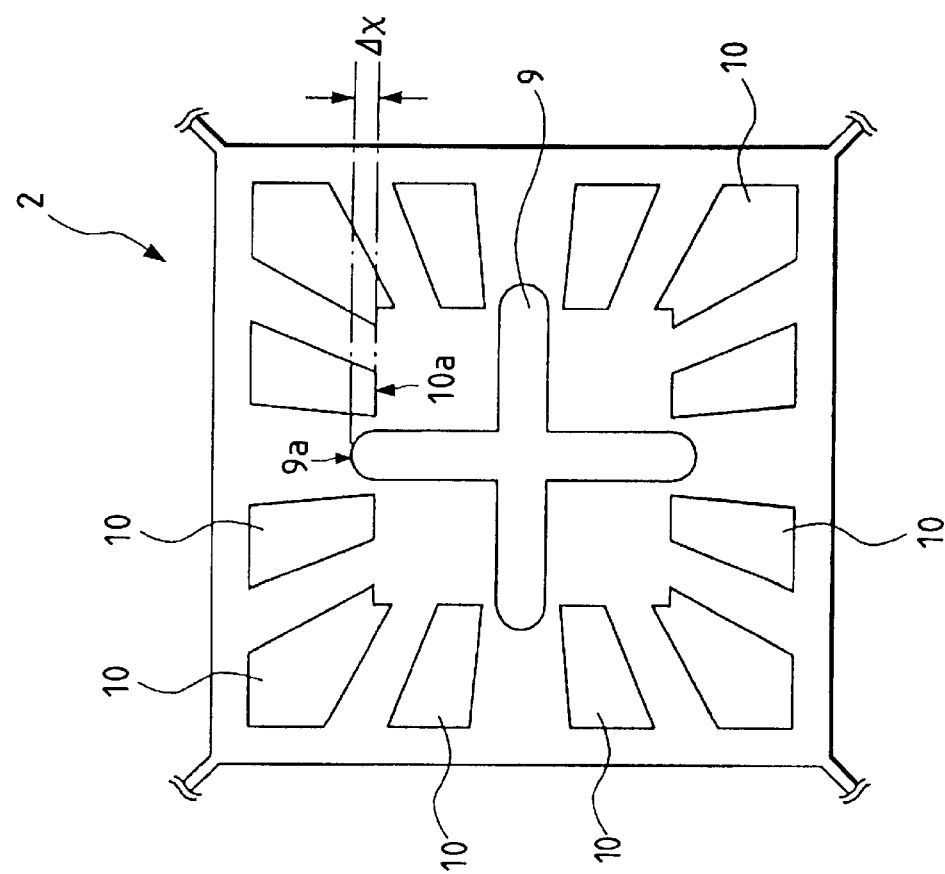
FIG. 3 is a plan view illustrating a state where a semiconductor chip of a large size is mounted on the die pad of the lead frame shown in FIGS. 1 and 2.
Figure 4:
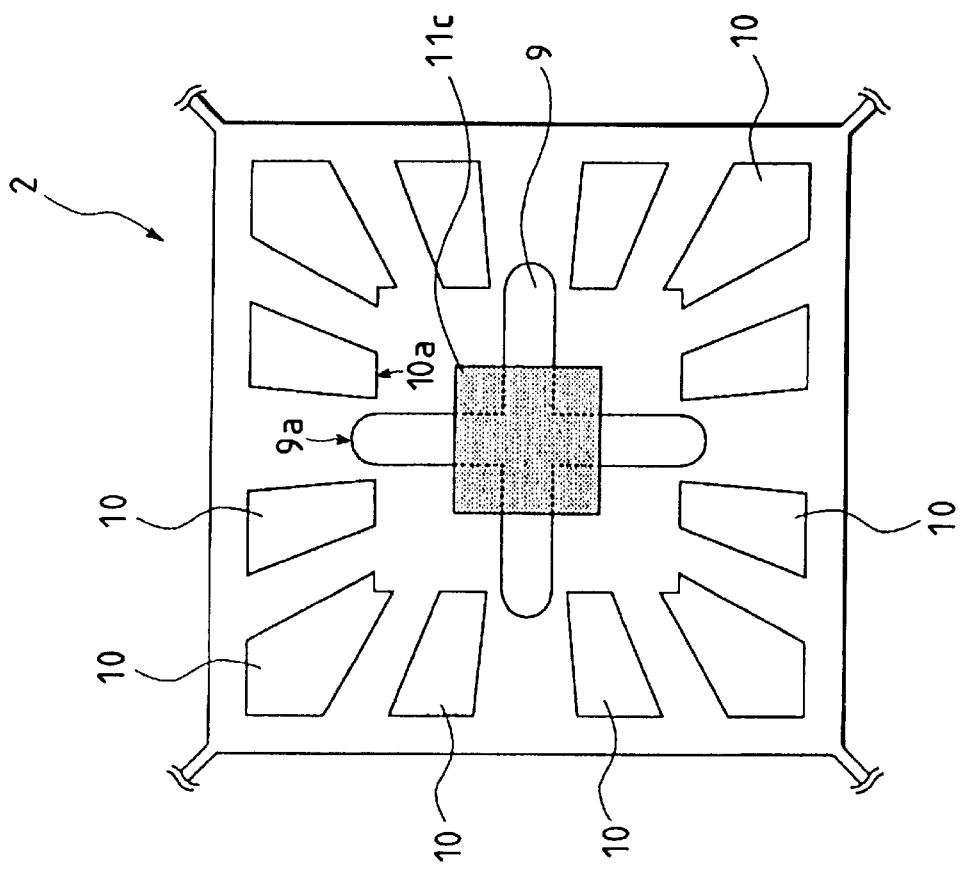
FIG. 4 is a plan view illustrating a state where a semiconductor chip of a medium size is mounted on the die pad of the lead frame shown in FIGS. 1 and 2.
Figure 5:
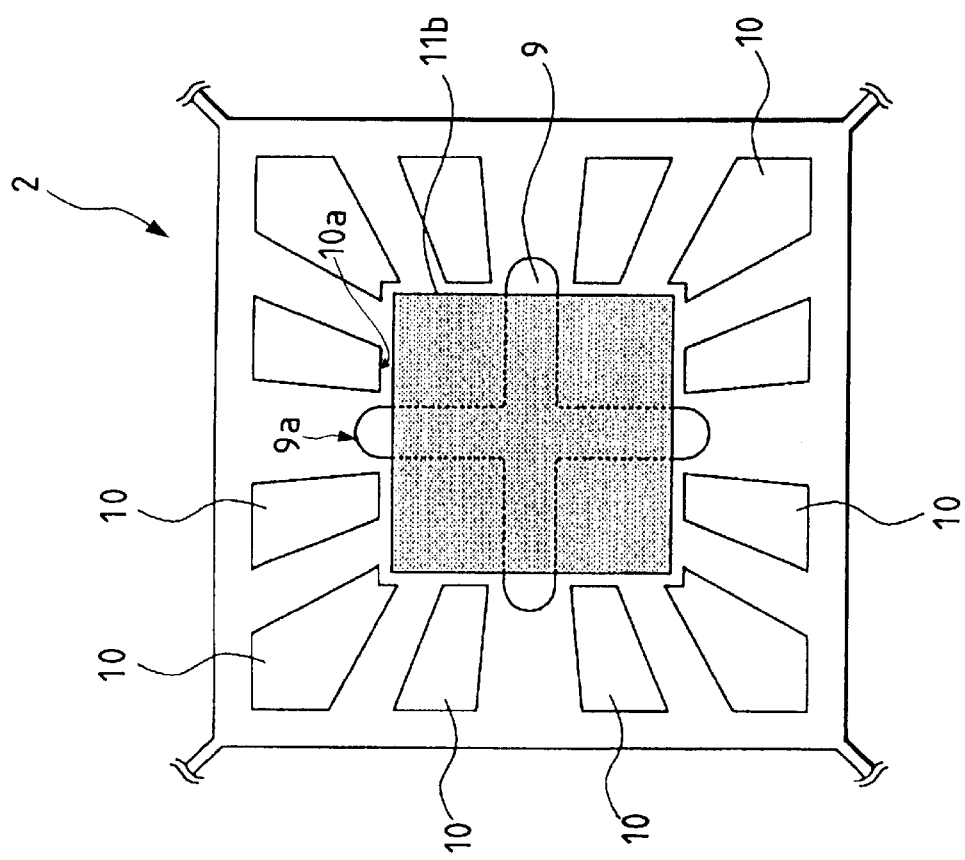
FIG. 5 is a plan view illustrating a state where a semiconductor chip of a small size is mounted on the die pad of the lead frame shown in FIGS. 1 and 2.

FIGS. 3 to 5 are plan views illustrating examples of various semiconductor chips 11 (11a to 11c) made of, for example, silicon and having different outside dimensions, which are mounted on the die pad 2 in which the slits 9, 10 are formed as described above. The semiconductor chips 11a to 11c have on the main surfaces thereof integrated circuits constituted by a number of semiconductor elements, and along the periphery of the main surfaces are formed external terminals (bonding pads) for inputting and outputting electric signals of the integrated circuits.

FIG. 3 illustrates an example of mounting a semiconductor chip 11a having large outside dimensions. In this example, the whole slit 9 and most of the slits 10 overlap with the semiconductor chip 11a. When the semiconductor chip 11a is molded with the resin, therefore, most of the back surface comes into direct contact with the resin through the slits 9 and 10.

In this embodiment, furthermore, when the die pad 2 is viewed from above, a gap is formed between the outer peripheral edges of the semiconductor chip 11a (i.e., side surface of the semiconductor chip 11a) and the outer peripheral ends of the slits 10. Therefore, when the resin is cast into the cavity after mounting the lead frame 1 on the metal mold, the resin flowing over the semiconductor chip 11a also flows into the lower side of the semiconductor chip 11a via the gap and, on the other hand, the resin flowing under the semiconductor chip 11a flows into the upper side of the semiconductor chip 11a via the gap. Therefore, the molding resin over the semiconductor chip 11 and the molding resin under the semiconductor chip 11a are coupled to each other by the sides of the semiconductor chip 11a.

FIG. 4 illustrates an example of mounting a semiconductor chip 11b having outside diameters smaller than those of the semiconductor chip 11a. In this example in which outer peripheral edges of the semiconductor chip 11b are located on the inside of the slits 10, when the semiconductor chip 11b is molded with the resin, the back surface of the semiconductor chip 11b partly comes into direct contact with the resin through the slit 9 of the cross shape.

In this example, furthermore, when the resin is cast into the cavity after mounting the lead frame 1 on the metal mold, the resin flowing over (or under) the semiconductor chip 11b flows into the lower side (or upper side) of the semiconductor chip 11b through the slits 10 and gaps between the outer peripheral edges of the semiconductor chip 11b and the ends 9a of the slit 9.

FIG. 5 illustrates an example of mounting a semiconductor chip 11c having outside dimensions smaller than those of the semiconductor chip 11b. In this example, when the semiconductor chip 11c is molded with the resin, the back surface of the semiconductor chip 11c mostly comes into direct contact with the resin through the cross-shaped slit 9.

In this example, furthermore, when the resin is cast into the cavity after mounting the lead frame 1 on the metal mold, the resin flowing over (or under) the semiconductor chip 11c flows into the lower side (or upper side) of the semiconductor chip 11c through the slits 10 and gaps between the outer peripheral edges of the semiconductor chip 11c and the ends of the slit 9.

In this embodiment as described above, the die pad 2 of the lead frame 1 is so constituted as to mount various kinds of semiconductor chips 11 (11a to 11c) having different outside dimensions. Moreover, when the semiconductor chip 11 having any outside dimensions is mounted on the die pad 2, the back surface of the semiconductor chip 11 is partly brought into direct contact with the molding resin. At the time of molding, furthermore, the resin flowing over (or under) the semiconductor chip 11 is allowed to flow into the opposite space through the slits 10 (or further through the slit 9).

In order to cause the resin flowing over (or under) the semiconductor chip 11 to flow into the opposite space through the slits 10 (or further through the slit 9), gaps must at least be formed between the outer peripheral edges of the semiconductor chip 11 and the outer peripheral ends of the slits 10. That is, the semiconductor chip 11 having the greatest outside dimensions mounted on the die pad 2 must be such that the outer peripheral edges thereof are located nearer the central side of the die pad 2 than the outer peripheral ends of the slits 10.

There is, however, no lower limit to the outside dimensions of the semiconductor chip 11 mounted on the die pad 2. However, when there is mounted a semiconductor chip 11 which is very smaller than the outside dimensions of the die pad 2, the distance becomes too long from the outer peripheral edges of the die pad 2 to the semiconductor chip 11. As a result, the efficiency of electrically connecting the semiconductor chip 11 and the leads 4 together lowers.

Therefore, though there is no particular limitation, it is desirable that the semiconductor chip 11 of even the greatest size has a side which is shorter than a side of the die pad 2 by at least 2 mm or more, and the difference of the lengths between a side of the semiconductor chip 11 of even the smallest size and a side of the die pad 2 does not exceed 20 mm.

Figure 6:
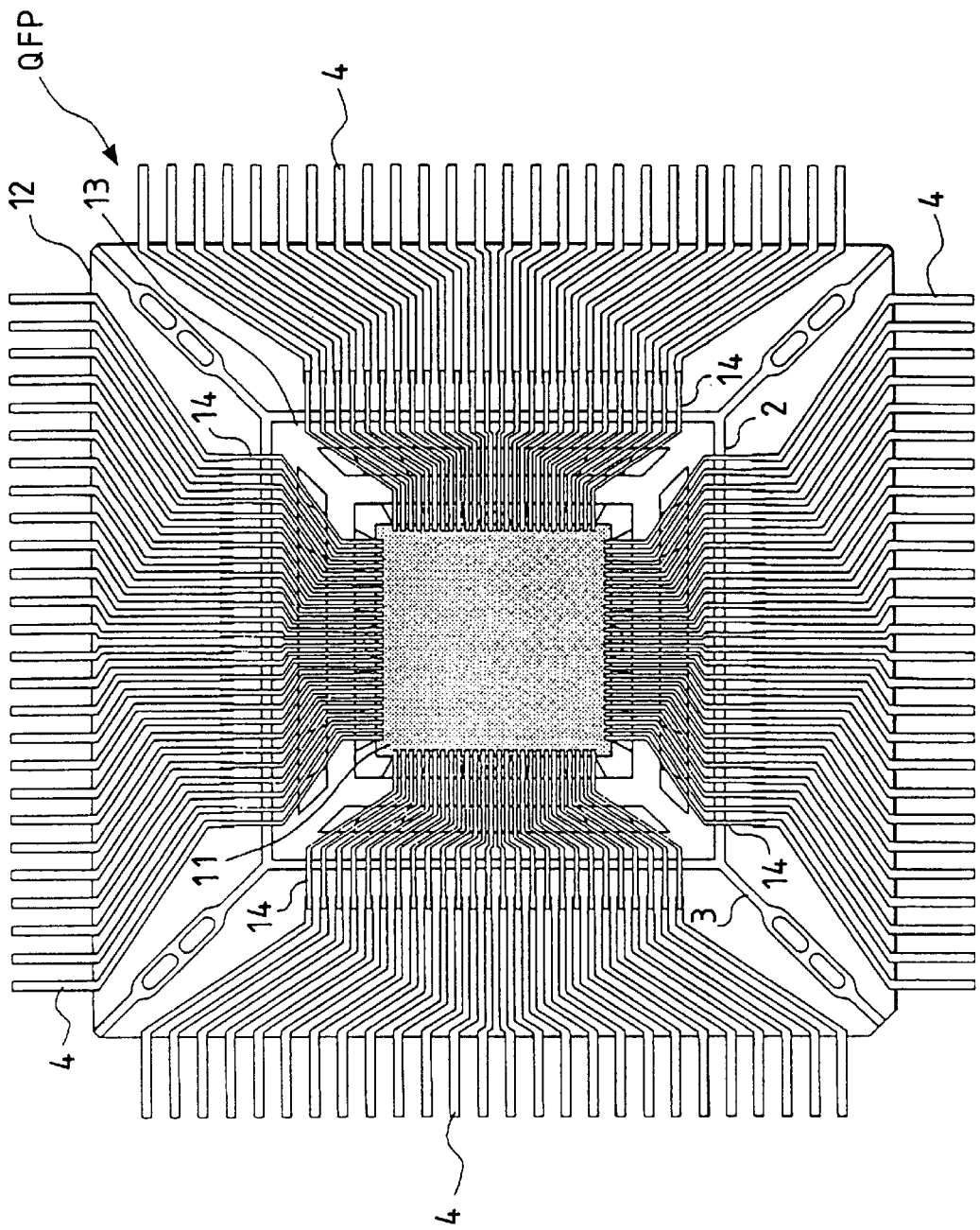
FIG. 6 is a plan view of a QFP including a device of TAB structure constituted by using the lead frame shown in FIGS. 1 and 2.
Figure 7:
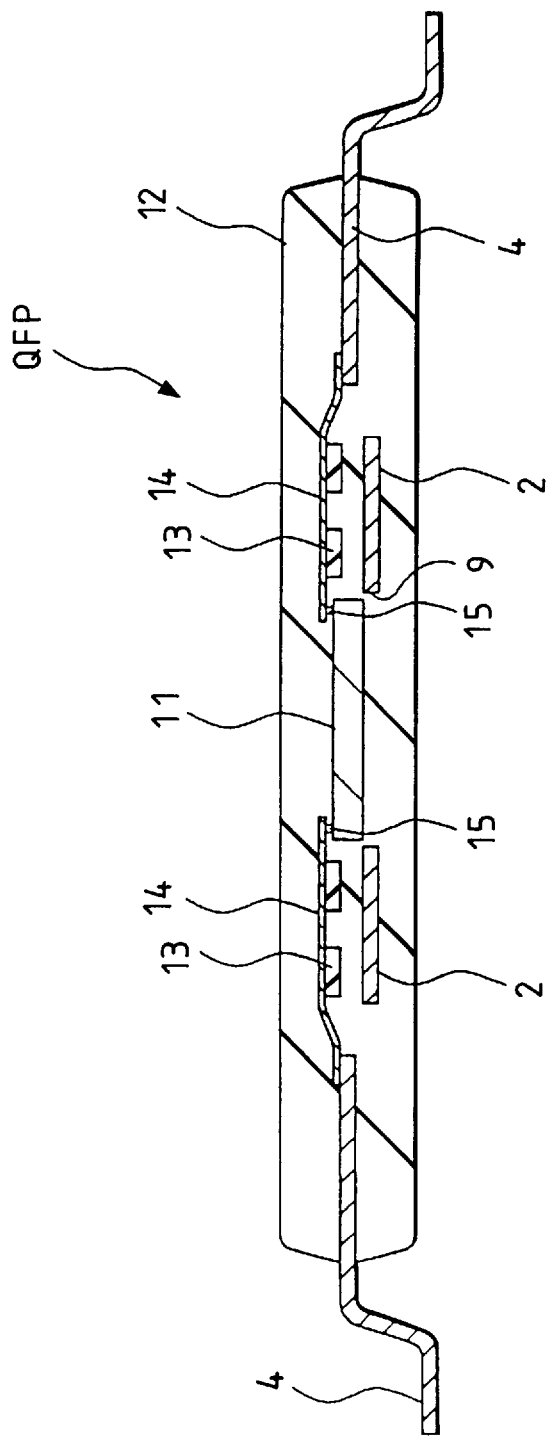
FIG. 7 is a sectional view corresponding to the QFP of FIG. 6.

Next, described below is a QFP produced by using the lead frame 1 of this embodiment. FIG. 6 is a plan view of the QFP (a plan view illustrating the state where the upper half of the package body is removed to expose the semiconductor chip), and FIG. 7 is a sectional view thereof.

The package body 12 of the QFP is constituted by an epoxy synthetic resin molded by the transfer molding method. This resin contains silica in order to bring the coefficient of thermal expansion of the package body 12 close to the coefficient of thermal expansion ($4.2 \times 10^{-6}/°C$) of silicon.

At the center of the package body 12 is disposed the die pad 2 of the lead frame 1, and a semiconductor chip 11, of single crystalline silicon and forming a logic LSI such as an ASIC, is mounted thereon. The die pad 2 has a square shape with a side of about 20 mm and the semiconductor chip 11 has a square shape with a side of about 10 mm.

In this embodiment, the semiconductor chip 11 has outer peripheral edges which are located more slightly inside than the ends 9a of the cross-shaped slit 9. Accordingly, the back surface of the semiconductor chip 11 is partly brought into direct contact with the resin through the slit 9 as shown in FIG. 7.

In the QFP of this embodiment, the semiconductor chip 11 mounted on the die pad 2 and the leads 4 are electrically connected together by the TAB system. That is, a TAB tape 13 is disposed between the semiconductor chip 11 and the leads 4, the ends on one side of leads 14 formed on one side of the TAB tape 13 are joined to gold bump electrodes 15 that are disposed along the outer periphery of the element-forming surface (upper surface) of the semiconductor chip 11, and the ends on the other side of the leads 14 are joined to the leads 4.

The TAB tape 13 is constituted by a synthetic resin such as polyimide, BT resin or the like. The leads 14 are formed by etching a copper foil having a thickness of about 35 μm and sticking the etched foils onto one surface of the TAB tape 13, and the surfaces thereof are plated with gold or tin. The leads 14 have a width of about 30 μm at an end where they are joined to the bump electrodes 15 of the semiconductor chip 11 and have a width of about 100 to 150 μm at the other end where they are joined to the leads 4 of the lead frame 1.

The surfaces of the inner lead portions of the leads 4 to which are connected the other ends of the leads 14 are plated with gold or tin. The other ends (outer leads) of the leads 4 outwardly extend beyond the four sides of the package body 12 to constitute external terminals of the QFP. The outer lead portions have the shape of a gull wing, and the surfaces thereof are plated with solder.

Figure 8:
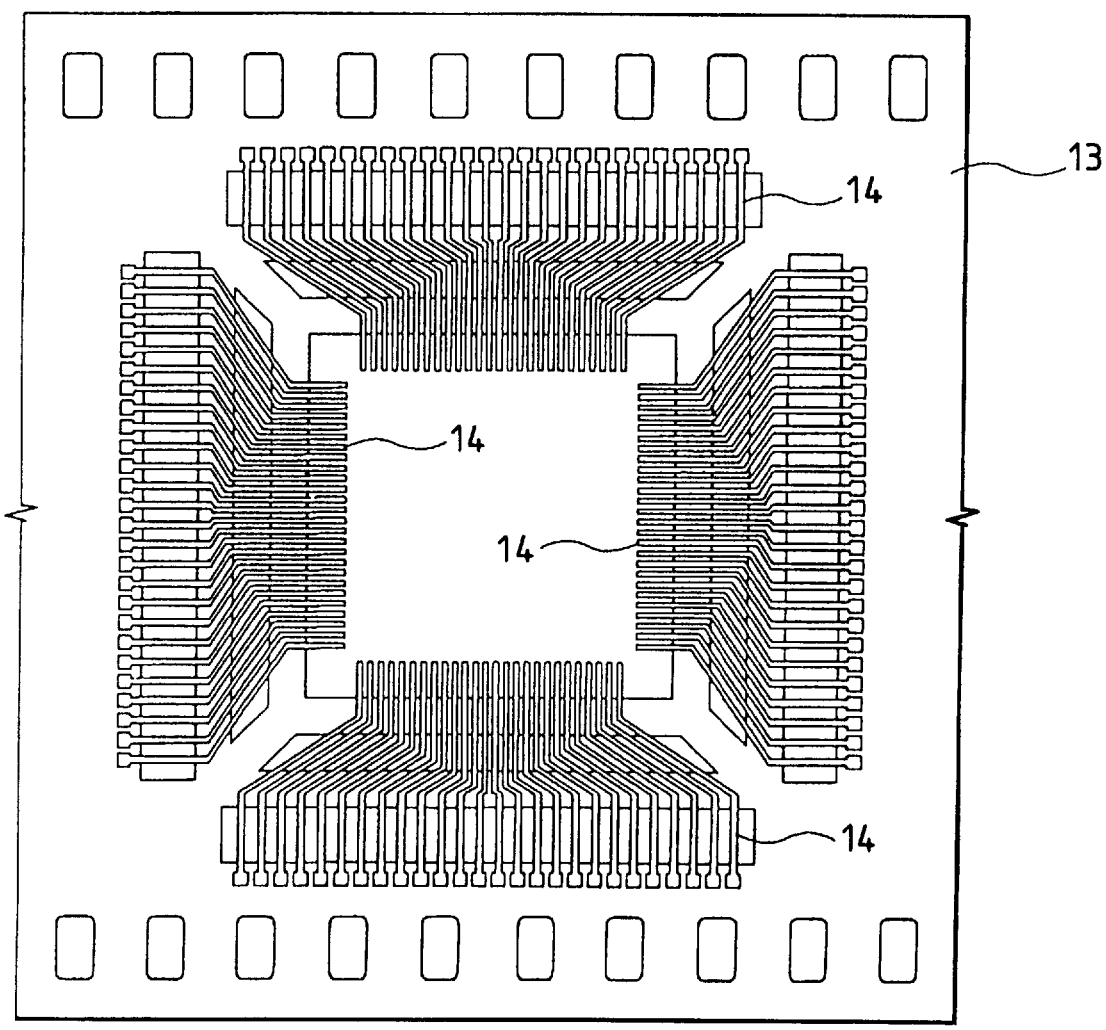
FIG. 8 is a plan view of a TAB tape used for assembling the QFP of FIGS. 6 and 7.
Figure 9:
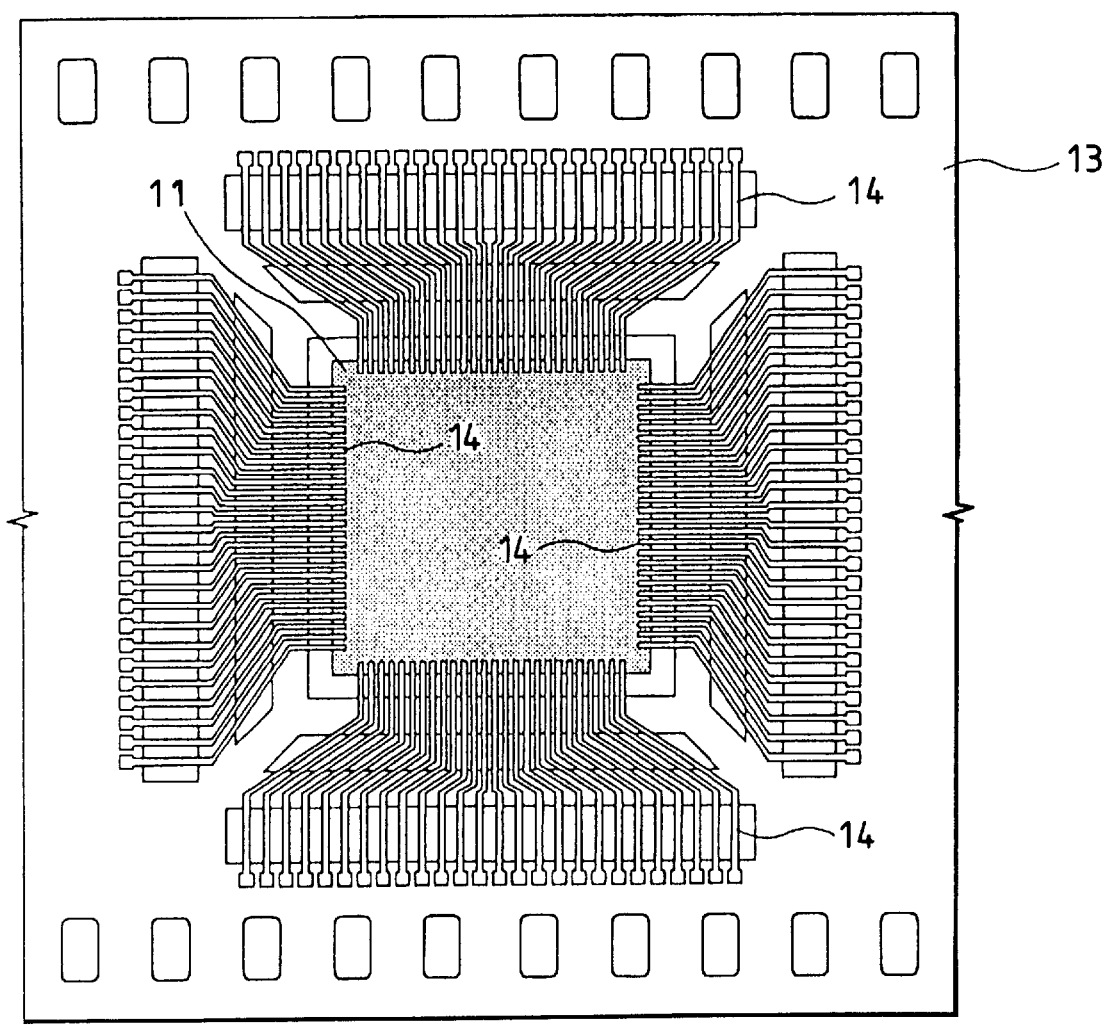
FIG. 9 is a plan view illustrating a state where a semiconductor chip is bonded to the TAB tape shown in FIG. 8.

To assemble the QFP, the TAB tape 13 having the leads 14 on one side as shown in FIG. 8 is prepared separately from the above-mentioned lead frame 1. Moreover, the gold bump electrodes 15 are formed in advance on the bonding pads of the semiconductor chip 11. As shown in FIG. 9, the one ends of the leads 14 and the bump electrodes 15 of the semiconductor chip 11 are connected together at one time by using a known TAB bonding device.

Figure 10:
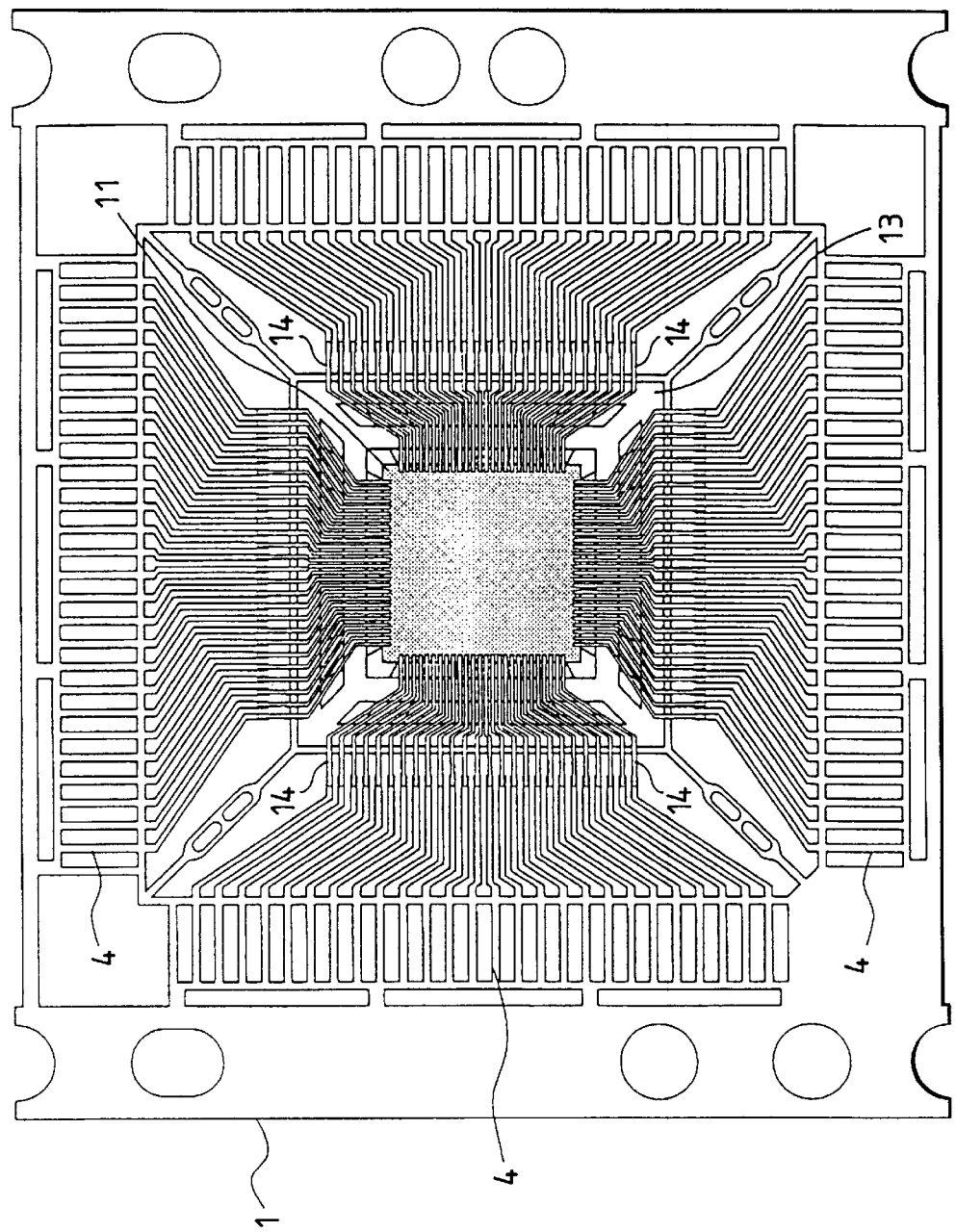
FIG. 10 is a plan view illustrating a state where the TAB tape is bonded to the lead frame shown in FIG. 9.

Unnecessary portions of the TAB tape 13 are cut and removed. Then, as shown in FIG. 10, the semiconductor chip 11 is positioned on the die pad 2 of the lead frame 1, and the other ends of the leads and the inner lead portions are at one time connected together by using a known bonding device.

When the leads 4 and the semiconductor chip 11 are connected together by the TAB method as in this embodiment, the semiconductor chip 11 need not necessarily be joined to the die pad 2. Besides, the TAB method makes it possible to connect the chip and leads relatively firmly, and therefore, generally there is little need of forming the die pad 2 which is a member for supporting the chip. By taking the generation of heat of the chip into consideration, however, the semiconductor chip 11 is joined to the die pad 2 by using the lead frame having a die pad and by using an electrically conductive adhesive such as a silver paste prior to the bonding. Therefore, part of the heat generated in the semiconductor chip 11 is radiated to the outside through the leads 14 and the leads 4, and the other part of heat is quickly diffused into the whole package body 2 through the die pad 2 of a large area and is radiated to the outside from the surfaces thereof, making it possible to decrease the thermal resistance of the QFP. That is, when the device of the TAB structure is adapted to a QFP package, the die pad which is considerably larger than the semiconductor chip 11 is utilized as a heat spreader to improve the radiation of heat. It is therefore possible to provide a package structure having an improved thermal reliability and an increased number of pins. When the device of TAB structure is adapted to a QFP package, furthermore, it is preferable that the lead frame which includes the die pad 2 is made of a copper frame from the standpoint of high efficiency radiation of the heat. Even when the die pad 2 is used as the heat spreader, it is preferable to provide slits 9 and 10 as shown in FIGS. 1 and 2. For the purpose of ordinary heat radiation, the die pad 2 needs to have a large area and therefore there is no need of forming slits. Considering the prevention of reflow cracks and the stability at the time of resin molding, however, it is necessary to form slits.

The lead frame 1 is mounted on the mold to mold he package body 12, undesired portions of the lead frame 1 exposed to the outside of the package body 12 are cut and removed and, finally, the outer lead portions of the leads 4 are formed in the shape of a gull wing to finish the assembling of a QFP.

The embodiment constituted as described above has the following effects.

The slit 9 of a cross shape is formed at the center of the die pad 2 of the lead frame 1, a plurality of slits 10 are formed in the outer periphery of the die pad 2 to surround the slit 9, and ends 9a of the slit 9 intersect lines (not shown) defined by the ends 10a of the neighboring slits 10. Therefore, even when the semiconductor chip 11 having any outside dimensions is mounted on the die pad 2, the back surface of the semiconductor chip 11 partly comes into direct contact with the molding resin, making it possible to firmly join the semiconductor chip 11 to the molding resin together.

Accordingly, separation of the die pad 2 and the molding resin at the interface is suppressed, package cracks and corrosion to the wiring are prevented, and a QFP having an improved reliability is obtained.

Moreover, even when the semiconductor chip 11 of any outside dimensions is mounted, the resin flowing over (or under) the semiconductor chip 11 at the time of molding is allowed to flow into the space of the opposite side of the semiconductor chip 11 through slits 10 (or further through the slit 9).

During the molding, therefore, the resin flows uniformly over and under the semiconductor chip 11, stress builds up less in the package body 2, and a highly reliable QFP is obtained.

With the semiconductor chip 11 mounted on the die pad 2 having a large area, the heat generated in the semiconductor chip 11 partly and quickly diffuses into the whole package body 2 through the die pad 2 and is radiated to the outside from the surfaces thereof, making it possible to obtain a QFP having a decreased thermal resistance.

A variety of semiconductor chips 11 having different outside dimensions can be mounted on the die pad 2 and, hence, the lead frame can be standardized eliminating the need of newly designing a lead frame for every kind of the devices.

This makes it possible to achieve lower cost production, multi-kind small-quantity production, and QTAT production of logic LSIs.

When the semiconductor chip 11 and the leads 4 are connected together by wire bonding, the distance between the leads 4 and the semiconductor chip 11 increases as the outside dimensions of the semiconductor chip 11 becomes small compared to the those of the die pad 2, and the wires may come into contact with the edges of the die pad 2 to cause short-circuiting.

On the other hand, when the semiconductor chip 11 and the leads 4 are connected together by the TAB method as in this embodiment, the wires are not short-circuited, and the reliability and production yields of the QFP can be improved.

In the case of the wire bonding method, furthermore, limitation is imposed on the number of pins of the QFP since the pitches among the inner lead portions of the leads 4 cannot be so much decreased. The TAB method, however, allows the pitches among the inner lead portions to become narrower than those in the wire bonding method. In this embodiment employing the TAB method, therefore, it is possible to increase the number of pins of the QFP.

In the case of the wire bonding method, furthermore, wires are bonded to connect the semiconductor chip 1 and the leads 4 one by one, requiring a long period of time for this bonding as compared with the TAB method in which the semiconductor chip 11 and the leads 4 are connected together at one time. That is, in this embodiment which employs the TAB method, it is allowed to raise the throughput in the step of bonding the QFP.

Embodiment 2

The above-mentioned embodiment 1 is an example so produced that the semiconductor chip 11 and the leads 4 are connected by the TAB method. This embodiment is an example so produced that the semiconductor chip 11 and the leads 4 are connected together by wire bonding.

When the wire bonding method is employed as described above, the wires tend to come into contact with the edges of the die pad 2, short-circuiting may occur when a semiconductor chip 11 having small outside dimensions is mounted on the die pad 2,.and it becomes necessary to overcome this problem.

Figure 11:
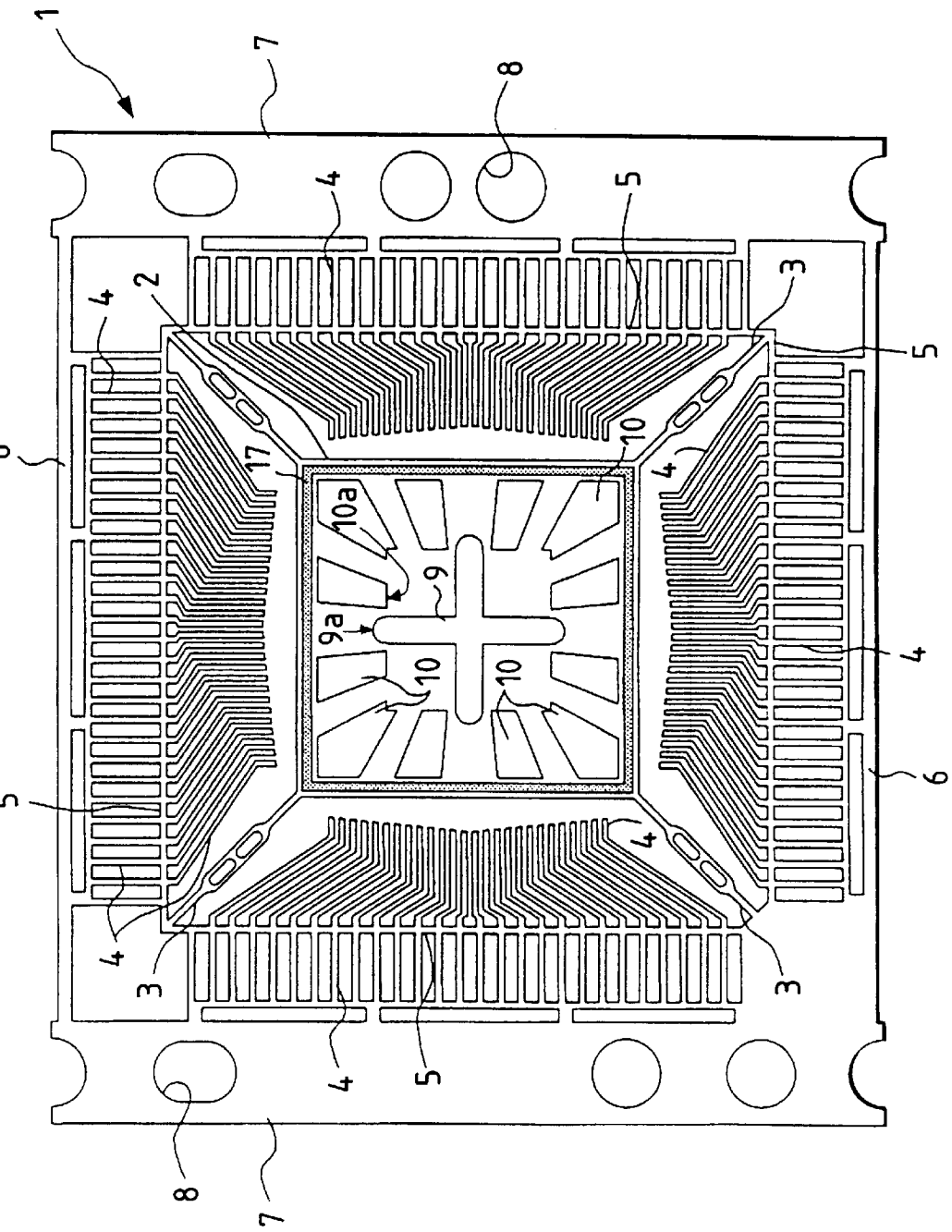
FIG. 11 is a plan view of a lead frame of an embodiment 2 of the present invention.

FIG. 11 is a plan view of the lead frame 1 of this embodiment. The above-mentioned slit 9 of a cross shape and the plurality of slits 10 are made in the die pad 2 of the lead frame 1, and a belt-like insulating film 17 is joined to the outer sides of the slits 10 along the edges of the die pad 2. The insulating film 17 is a synthetic resin film such as of polyimide and is stuck to the surface of the die pad 2 with an adhesive agent.

Figure 12:
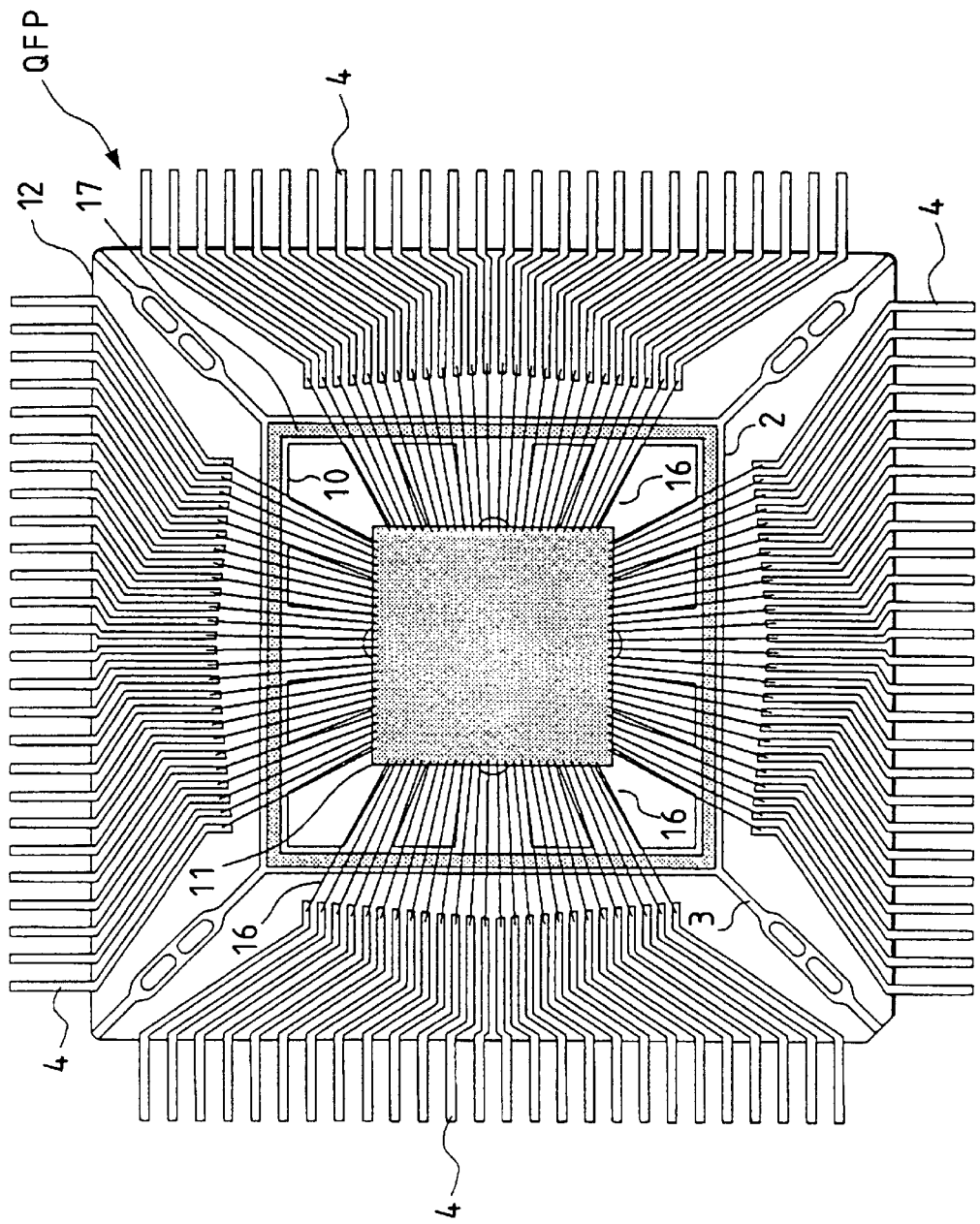
FIG. 12 is a plan view of a QFP using the lead frame shown in FIG. 11.
Figure 13:
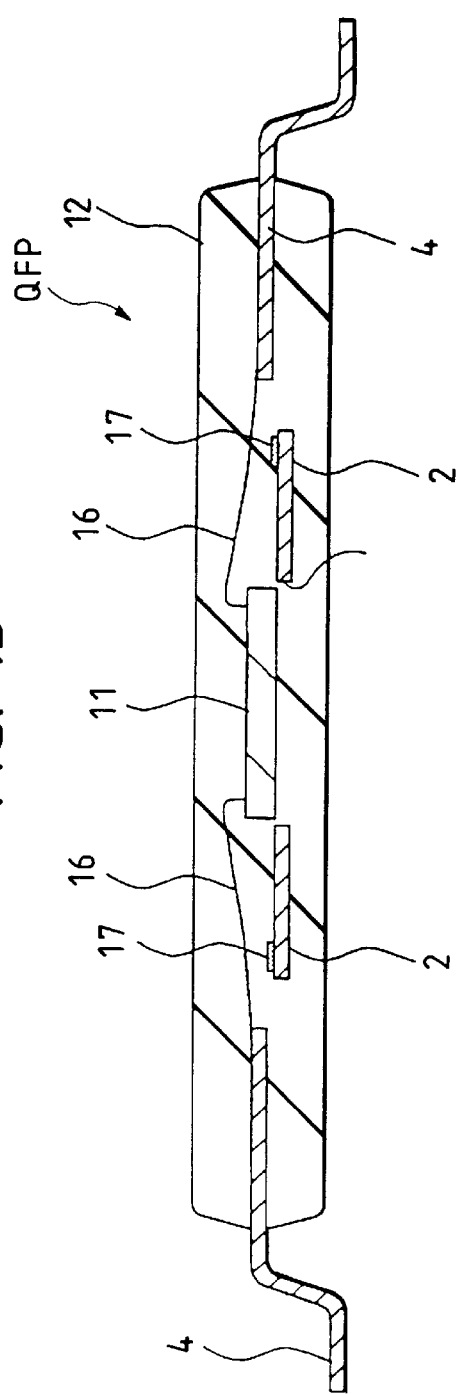
FIG. 13 is a sectional view corresponding to the QFP of FIG. 12.

FIG. 12 is a plan view of a QFP (plan view illustrating a state where the upper half of the package body is removed to expose the semiconductor chip) manufactured by using the lead frame 1 of this embodiment, and FIG. 13 is a sectional view.

The die pad of the lead frame 1 is disposed at the center of the package body 12, and the semiconductor chip 11 is joined thereto using an adhesive such as a silver paste. Furthermore, the semiconductor chip 11 and the leads 4 are electrically connected together through wires 16. The die pad 2 has a square shape with a side of about 20 mm, and the semiconductor chip 11 has a square shape with a side of about 10mm. The wires 16 are gold wires having a diameter of about 30 μm. The QFP of this embodiment can be assembled by the same method as the conventional method of assembling QFPs that employs the wire bonding method.

In this embodiment, the outside dimensions of the semiconductor chip 11 is about one-half that of the die pad 2 whereby the distance between the leads 4 and the semiconductor chip 11 increases, and the wires 16 may sag down to come into contact with the edges of the die pad 2. Since the insulating film 17 is provided at the edges of the die pad 2, however, the wires 16 do not come into direct contact with the die pad 2.

In this embodiment, as described above, it is possible to reliably prevent the short-circuiting between the wires 16 and the die pad 2 even when there is mounted a semiconductor chip 11 having outside dimensions very smaller than those of the die pad 2.

In this embodiment which employs the wire bonding method requiring a small number of constituent parts compared with the TAB method, therefore, the QFP can be produced at a reduced cost.

Embodiment 3

Figure 14:
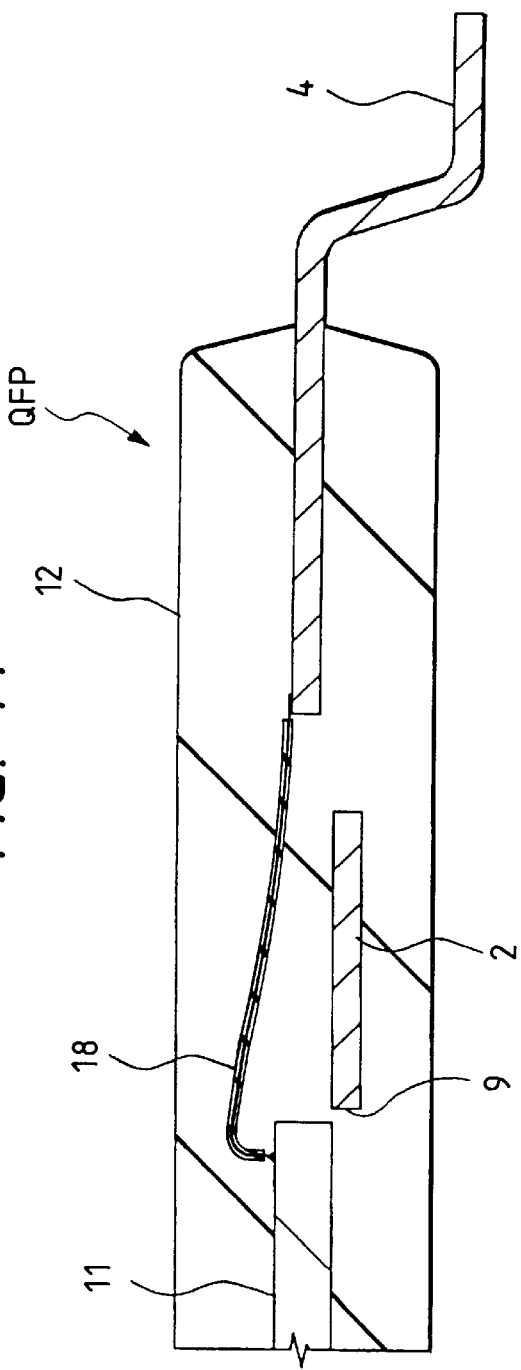
FIG. 14 is a sectional view illustrating an essential portion of the QFP of an embodiment 3 of the present invention.

FIG. 14 is a sectional view illustrating an essential portion of the QFP of this embodiment.

In this embodiment like in the above-mentioned embodiment 2, the semiconductor chip 11 and the leads 4 are connected together by wire bonding. In this embodiment, however, the semiconductor chip 11 and the leads 4 are connected together using coated wires 18 in contrast with the embodiment 2 in which the insulating film 17 is provided along the outer circumference of the die pad 2.

The coated wires 18 are manufactured by coating the surfaces of gold wires with an insulating layer such as of an epoxy resin, a polyacetal resin or a polyurethane resin, and can be manufactured by a method disclosed in, for example, Japanese Patent Laid-Open No. 304943/1990.

In this embodiment, the gold wires do not come into direct contact with the die pad 2 even when the coated wires 18 sag down to come into contact with the edges of the die pad 2. Like in the above-mentioned embodiment 2, therefore, it is possible to reliably prevent the short-circuiting between the gold wires and the die pad 2.

In this embodiment which uses the coated wires 18, it is possible to reliably prevent the neighboring gold wires from being short-circuited and, hence, the number of pins of the QFP can be increased by decreasing the pitches among the leads 4.

In the foregoing, the invention accomplished by the present inventors has been described by way of embodiments. It should, however, be noted that the present invention is in no way limited to the above-mentioned embodiments, but can be modified in a variety of other ways without departing from the gist and scope of the invention.

The package is not limited to the QFP but can further be adapted to a variety kinds of resin-encapsulated LSI packages.

Furthermore, the slits made in the die pad of the lead frame are not limited to those of the shapes mentioned in the above embodiments. The shapes of the first and second slits can be arbitrarily designed and changed as long as the ends of the first slit made at the center of the die pad and lines passing through the ends of the second slits made in the outer periphery of the die pad intersect.

Figure 15:
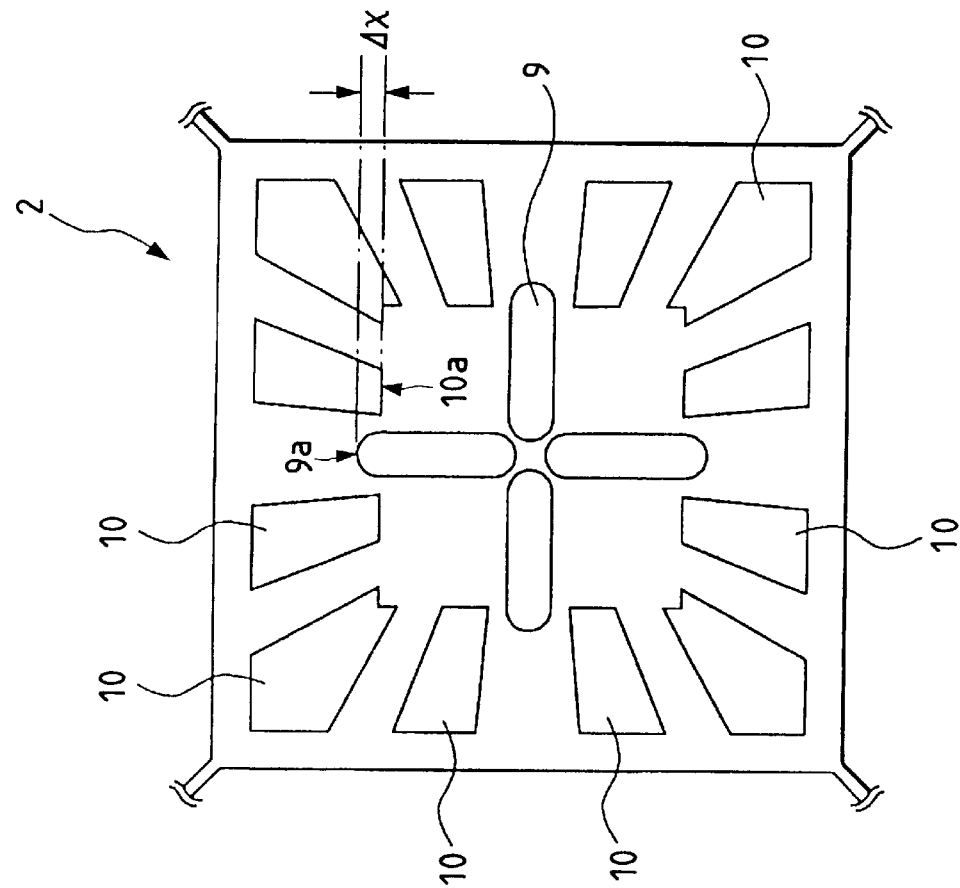
FIGS. 15 to 17 are enlarged plan views illustrating die pads of lead frames according to modified examples of the present invention.
Figure 16:
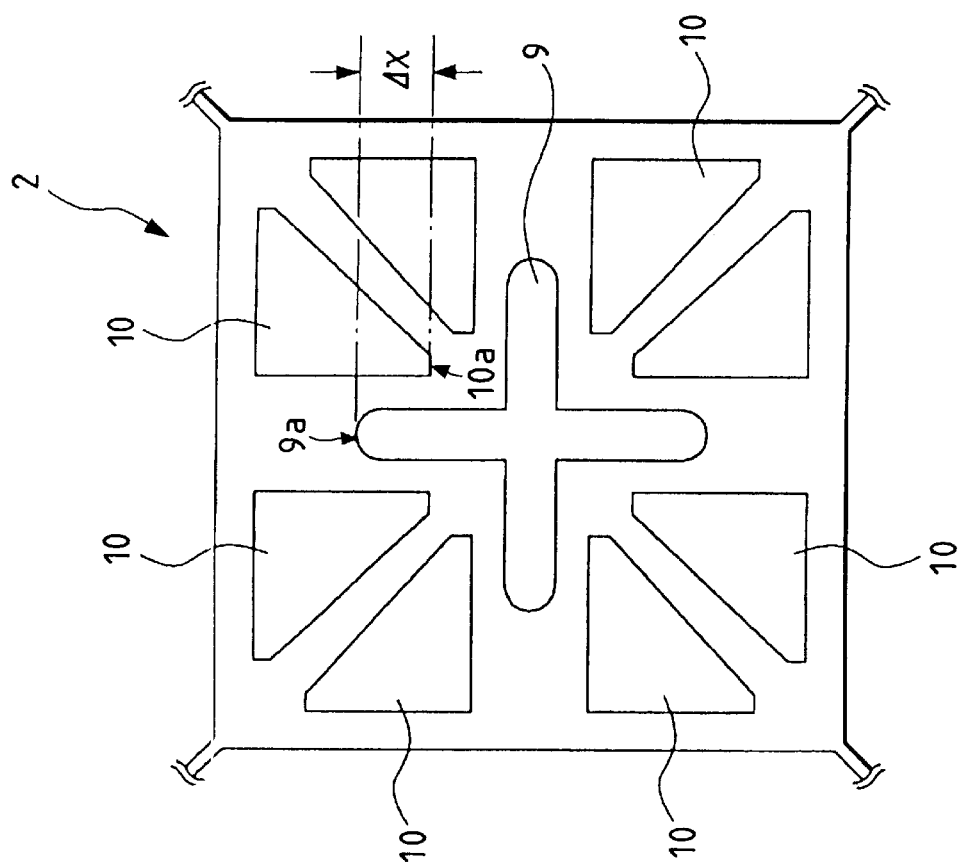
Figure 17:
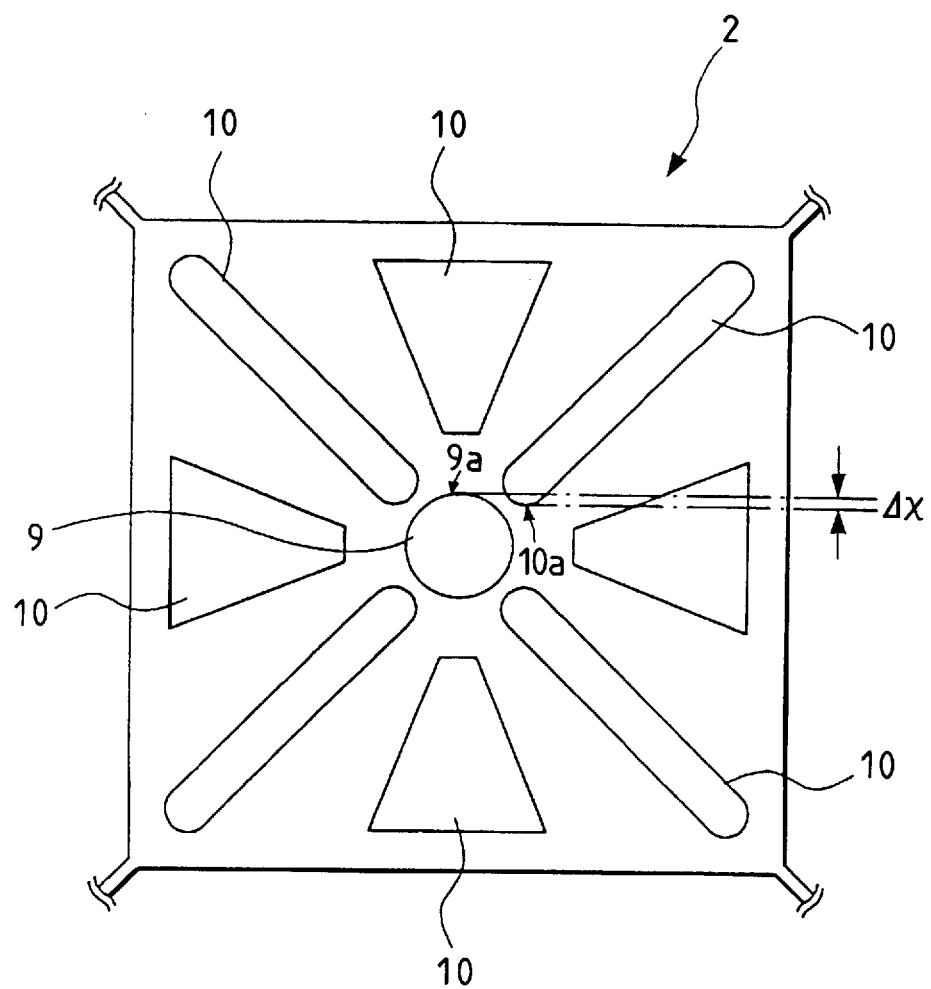

FIGS. 15 to 17 illustrate some examples of slit shapes. FIG. 15 illustrates an example in which the slits 10 arranged along the outer periphery of the slit 9 of a cross shape have a shape different from that of the above-mentioned embodiments. FIG. 16 illustrates an example in which the slit 9 of a cross shape is changed into four parts. FIG. 17 illustrates an example in which the slit 9 formed at the center of the die pad 2 has a circular shape. In any case, the ends 9a of the slit 9 and the lines passing through ends 10a of the neighboring slits 10 intersect to have the same effects as those of the aforementioned embodiments.

Briefly described below are the effects produced by a representative of the invention disclosed in this specification.

According to the present invention, when the semiconductor chip having any outside diameter is mounted on the die pad, the back surface of the semiconductor chip partly comes into direct contact with the molding resin, making it possible to firmly join the semiconductor chip and the molding resin together. Accordingly, separation at the interface is suppressed between the die pad and the molding resin, and package cracks and corrosion to the wiring are prevented.

According to the present invention, even when the semiconductor chip of any outside diameters is mounted on the die pad, the resin flowing over (or under) the semiconductor chip at the time of molding is allowed to flow into the opposite side of the semiconductor chip through slits. During the molding, therefore, the resin flows uniformly over and under the semiconductor chip and stress builds up less in the package body.

According to the present invention in which the semiconductor chip is mounted on the die pad having a large area, the heat generated in the semiconductor chip partly and quickly diffuses into the whole package body through the die pad and is radiated to the outside from the surfaces thereof, making it possible to obtain an LSI package having a decreased thermal resistance.

According to the present invention, a variety of semiconductor chips having different outside dimensions can be mounted on the die pad and, hence, and the lead frame can be standardized, eliminating the need of newly designing a lead frame for every kind of the devices This makes it possible to achieve low cost production, multi-kind small-quantity production and QTAT production of logic LSIs.

According to the present invention, it is possible to reliably prevent such a defect that the wires come into contact with the edges of the die pad to cause short-circuiting.

What is claimed is:

1. A semiconductor device comprising:

a die pad for mounting a semiconductor chip thereon and a plurality of first leads having ends and being arranged to surround said die pad, said die pad including a first slit and a second slit adjacent to said first slit, said first slit and said second slit being discontinuous with each other;

a semiconductor chip being mounted on said die pad and having bonding pads formed on a main surface of said semiconductor chip, said bonding pads being electrically connected with said ends of said plurality of first leads; and a resin molding for sealing said semiconductor chip, said die pad and a portion of said plurality of first leads, wherein said die pad is larger than said semiconductor chip, wherein said first slit extends from a center of said die pad toward a peripheral edge of said die pad and wherein a portion of said first slit that is closest to said peripheral edge of said die pad is referred to as an end portion of said first slit, wherein said second slit has a first end portion and a second end portion, wherein said first end portion of said second slit is closer to said peripheral edge of said die pad than said end portion of said first slit, and wherein said second end portion of said second slit is further from said peripheral edge of said die pad than said end portion of said first slit.

2. A semiconductor device according to claim 1, wherein said first end portion of said second slit is positioned outside of said semiconductor chip in a plane view.

3. A semiconductor device according to claim 2, wherein said first slit has a cross shape, and wherein said end portion of said first slit corresponds to one of four apexes of said cross shape.

4. A semiconductor device according to claim 3, wherein said die pad and said plurality of first leads are made of a single lead frame.

5. A semiconductor device according to claim 4, wherein said resin molding contacts a rear surface of said semiconductor chip via said first slit of said die pad.

6. A semiconductor device according to claim 5, wherein said semiconductor chip and said first slit are arranged to overlap each other.

7. A semiconductor device according to claim 6, further comprising a plurality second slits each having a first end portion and a second end portion, wherein the first end portion of each of the second slits is closer to said peripheral edge than said end portion of said first slit and the second end portion of each of the second slits is further from said peripheral edge than said end portion of said first slit.

8. A semiconductor device according to claim 1, wherein said first slit has a cross shape, and wherein said end portion of said first slit corresponds to one of four apexes of said cross shape.

9. A semiconductor device according to claim 1, wherein said die pad and said plurality of first leads are made of a single lead frame.

10. A semiconductor device according to claim 1, wherein said resin molding contacts a rear surface of said semiconductor chip via said first slit of said die pad.

11. A semiconductor device according to claim 1, wherein said semiconductor chip and said first slit are arranged to overlap each other.

12. A semiconductor device according to claim 1, further comprising in addition to said second slit a plurality of additional second slits each having a first end portion and a second end portion, wherein the first end portion of each of said additional second slits is closer to said peripheral edge than said end portion of said first slit and the second end portion of each of said additional second slits is further from said peripheral edge than said end portion of said first slit.

* * * * *